United States Patent
King et al.

(10) Patent No.: US 11,437,935 B2
(45) Date of Patent: Sep. 6, 2022

(54) HIGH EFFICIENCY TRANSDUCER DRIVER

(71) Applicant: Cirrus Logic International Semiconductor Ltd., Edinburgh (GB)

(72) Inventors: Eric J. King, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 1075 days.

(21) Appl. No.: 15/992,504

(22) Filed: May 30, 2018

(65) Prior Publication Data

US 2018/0351478 A1 Dec. 6, 2018

Related U.S. Application Data

(60) Provisional application No. 62/512,314, filed on May 30, 2017, provisional application No. 62/512,461, filed on May 30, 2017.

(51) Int. Cl.
| | |
|---|---|
| *H02N 2/00* | (2006.01) |
| *H03F 3/181* | (2006.01) |
| *H03F 3/21* | (2006.01) |
| *H03F 3/217* | (2006.01) |
| *H04R 17/00* | (2006.01) |
| *H03F 3/20* | (2006.01) |

(52) U.S. Cl.
CPC ......... *H02N 2/0075* (2013.01); *H03F 3/181* (2013.01); *H03F 3/21* (2013.01); *H03F 3/2173* (2013.01); *H03F 3/20* (2013.01); *H03F 2200/03* (2013.01); *H04R 17/00* (2013.01); *H04R 2499/11* (2013.01)

(58) Field of Classification Search
CPC ......... H02N 2/0075; H03F 3/181; H03F 3/21; H03F 3/2173; H03F 3/20; H03F 2200/03; H04R 17/00; H04R 2499/11; H01L 41/04; H02M 7/537; H02M 3/158
See application file for complete search history.

(56) References Cited

U.S. PATENT DOCUMENTS

| | | | | |
|---|---|---|---|---|
| 2008/0310046 | A1* | 12/2008 | Menegoli | H03F 1/0227 360/75 |
| 2015/0323947 | A1* | 11/2015 | Amadi | H02M 3/1582 323/280 |
| 2018/0115246 | A1* | 4/2018 | Azrai | H02M 3/335 |
| 2018/0130940 | A1* | 5/2018 | Chaput | H01L 41/042 |

* cited by examiner

*Primary Examiner* — Emily P Pham
(74) *Attorney, Agent, or Firm* — Jackson Walker L.L.P.

(57) ABSTRACT

A method may include controlling commutation of a plurality of switches of an output stage comprising the plurality of switches in order to transfer charge between an energy storage device and a load to generate an output voltage across the load as an amplified version of an input signal, wherein the load comprises capacitive energy storage and controlling the power converter in order to regulate a cumulative electrical energy present in the system at an energy target, wherein the power converter is configured to transfer electrical energy from a source of electrical energy coupled to an input of the power converter to the energy storage device coupled to the output of the power converter and configured to store the electrical energy transferred from the source of electrical energy.

22 Claims, 4 Drawing Sheets

HIGH EFFICIENCY TRANSDUCER DRIVER

RELATED APPLICATION

The present disclosure claims priority to U.S. Provisional Patent Application Ser. No. 62/512,314, filed May 30, 2017, and U.S. Provisional Patent Application Ser. No. 62/512,461, filed May 30, 2017, each of which is incorporated by reference herein in its entirety.

FIELD OF DISCLOSURE

The present disclosure relates in general to circuits for audio devices, piezoelectric devices, and/or haptic-feedback devices, including without limitation personal audio devices such as wireless telephones and media players, and more specifically, to a high-efficiency driver for driving a transducer, including a piezoelectric transducer.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones, one or more speakers, a piezoelectric transducer, a haptic feedback transducer, and/or other transducer. Such circuitry often includes a driver including a power amplifier for driving a transducer output signal to the transducer. Oftentimes, a power converter may be used to provide a supply voltage to a power amplifier in order to amplify a signal driven to speakers, headphones, piezoelectric transducers, haptic feedback transducers, or other transducers. A switching power converter is a type of electronic circuit that converts a source of power from one direct current (DC) voltage level to another DC voltage level. Examples of such switching DC-DC converters include but are not limited to a boost converter, a buck converter, a buck-boost converter, an inverting buck-boost converter, and other types of switching DC-DC converters. Thus, using a power converter, a DC voltage such as that provided by a battery may be converted to another DC voltage used to power the power amplifier.

Battery-powered systems may use a boost converter to generate a power supply for an audio amplifier that is greater than a voltage of the battery. For example, a motivation for using a boost converter in a battery-powered transducer is to generate a greater signal swing at the output of a transducer amplifier than could be achieved by powering the amplifier directly from the battery. However, power consumption of a transducer driver system is often a concern, particularly in battery-powered devices, and methods and systems are desired to reduce power consumption and extend battery life over that of existing approaches.

SUMMARY

In accordance with the teachings of the present disclosure, one or more disadvantages and problems associated with existing approaches to driving a transducer may be reduced or eliminated.

In accordance with embodiments of the present disclosure, a system may include a power converter configured to transfer electrical energy from a source of electrical energy coupled to an input of the power converter to an output of the power converter, the power converter comprising an energy storage device coupled to the output of the power converter and configured to store the electrical energy transferred from the source of electrical energy, an output stage configured to transfer electrical energy between the energy storage device and a load coupled to an output of the output stage, wherein the load comprises capacitive energy storage, and wherein the output stage comprising a plurality of switches, and a controller. The controller may be configured to control commutation of the plurality of switches of the output stage in order to transfer charge between the energy storage device and the load to generate an output voltage across the load as an amplified version of an input signal and control the power converter in order to regulate a cumulative electrical energy present in the system at an energy target.

In accordance with these and other embodiments of the present disclosure, a method may include controlling commutation of a plurality of switches of an output stage comprising the plurality of switches in order to transfer charge between an energy storage device and a load to generate an output voltage across the load as an amplified version of an input signal, wherein the load comprises capacitive energy storage and controlling the power converter in order to regulate a cumulative electrical energy present in the system at an energy target, wherein the power converter is configured to transfer electrical energy from a source of electrical energy coupled to an input of the power converter to the energy storage device coupled to the output of the power converter and configured to store the electrical energy transferred from the source of electrical energy.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
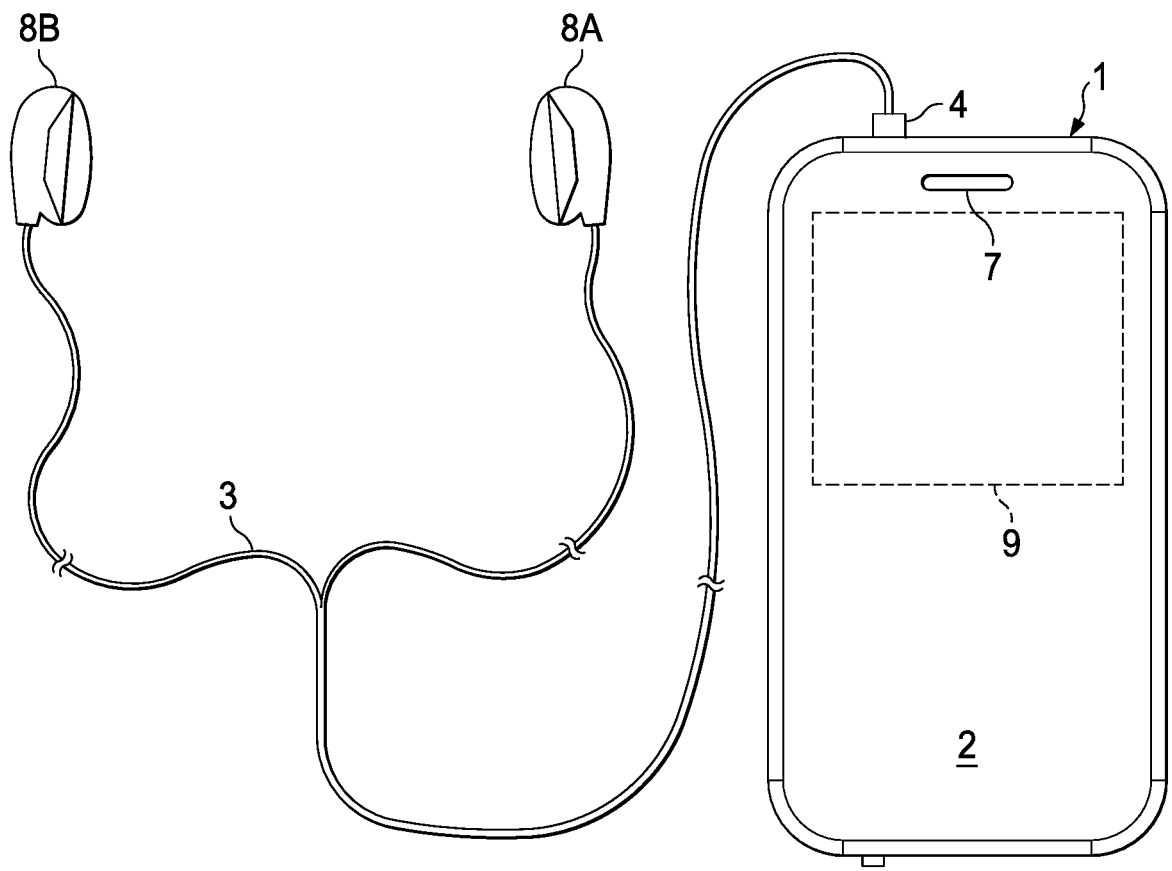
FIG. 1 illustrates an example personal mobile device, in accordance with embodiments of the present disclosure.

FIG. 1 illustrates an example personal mobile device 1, in accordance with embodiments of the present disclosure.

FIG. 1 depicts personal mobile device 1 having a speaker 7. Speaker 7 is merely an example, and it is understood that personal mobile device 1 may be used in connection with a variety of transducers including magnetic coil loudspeakers, piezo speakers, haptic feedback transducers, and others. In addition or alternatively, personal mobile device 1 may be coupled to a headset 3 in the form of a pair of earbud speakers 8A and 8B. Headset 3 depicted in FIG. 1 is merely an example, and it is understood that personal mobile device 1 may be used in connection with a variety of audio transducers, including without limitation, headphones, earbuds, in-ear earphones, and external speakers. A plug 4 may provide for connection of headset 3 to an electrical terminal of personal mobile device 1. Personal mobile device 1 may provide a display to a user and receive user input using a touch screen 2, or alternatively, a standard liquid crystal display (LCD) may be combined with various buttons, sliders, and/or dials disposed on the face and/or sides of personal mobile device 1. As also shown in FIG. 1, personal mobile device 1 may include an integrated circuit (IC) 9 for generating an analog signal for transmission to speaker 7, headset 3, and/or another transducer.

Figure 2:
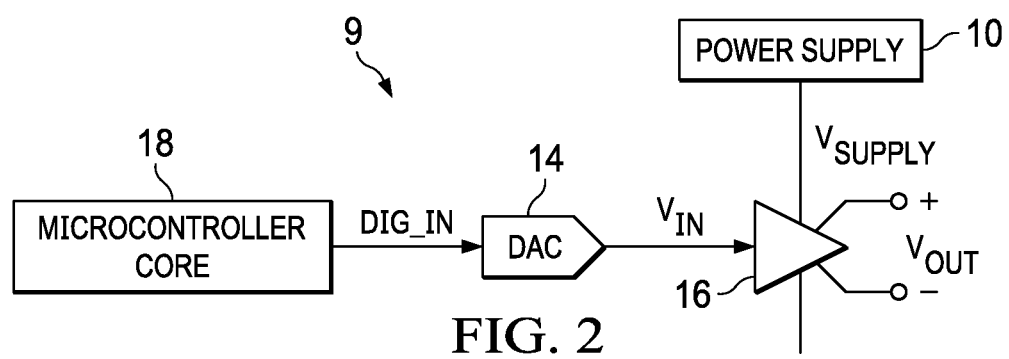
FIG. 2 illustrates a block diagram of selected components of an example integrated circuit of a personal mobile device for driving a transducer, in accordance with embodiments of the present disclosure.

FIG. 2 illustrates a block diagram of selected components of an example IC 9 of a personal mobile device for driving a transducer, in accordance with embodiments of the present disclosure. As shown in FIG. 2, a microcontroller core 18 may supply a digital input signal DIG_IN to a digital-to-analog converter (DAC) 14, which may convert the digital input signal to an analog input signal $V_{IN}$. DAC 14 may supply analog signal $V_{IN}$ to an amplifier 16 which may amplify or attenuate analog input signal $V_{IN}$ to provide a differential audio output signal $V_{OUT}$, which may operate a speaker, a headphone transducer, a piezoelectric transducer, a haptic feedback transducer, a line level signal output, and/or other suitable output. In some embodiments, DAC 14 may be an integral component of amplifier 16. A power supply 10 may provide the power supply rail inputs of amplifier 16. In some embodiments, power supply 10 may comprise a switched-mode power converter, as described in greater detail below. Although FIGS. 1 and 2 contemplate that IC 9 resides in a personal mobile device, systems and methods described herein may also be applied to electrical and electronic systems and devices other than a personal mobile device, including transducer systems for use in a computing device larger than a personal mobile device, an automobile, a building, or other structure.

Figure 3:
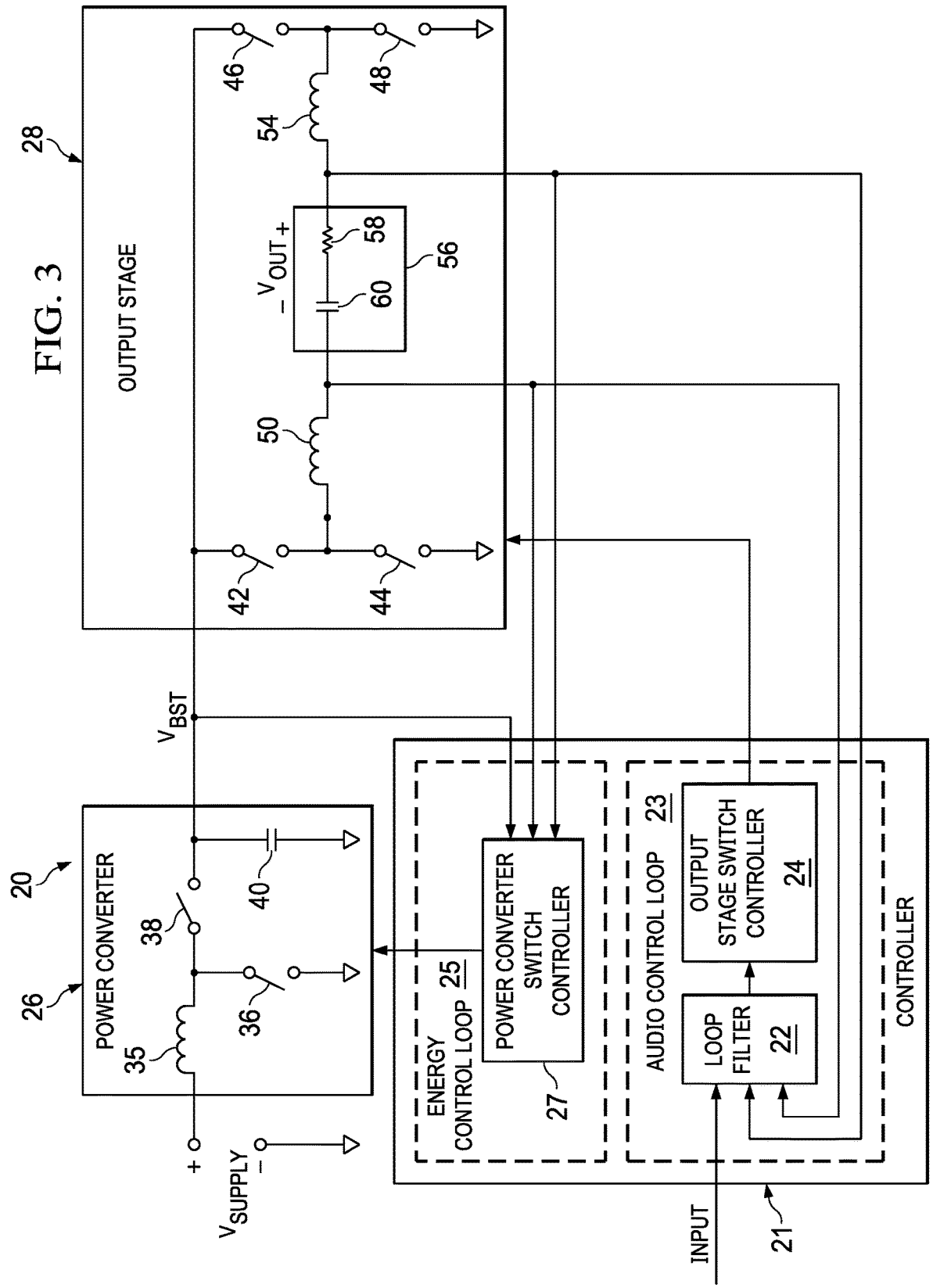
FIG. 3 illustrates a block and circuit diagram of selected components of an example switched mode amplifier, in accordance with embodiments of the present disclosure.

FIG. 3 illustrates a block and circuit diagram of selected components of an example switched mode amplifier 20, in accordance with embodiments of the present disclosure. In some embodiments, switched mode amplifier 20 may implement all or a portion of amplifier 16 described with respect to FIG. 2. As shown in FIG. 3, switched mode amplifier 20 may comprise a controller 21, a power converter 26, and an output stage 28.

Controller 21 may comprise any system, device, or apparatus configured to, implement an audio control loop 23 to control switches integral to output stage 28 based on an input signal (e.g., input signal INPUT), output signal (e.g., output signal $V_{OUT}$), and/or other characteristics of switched mode amplifier 20 in order to generate an output signal $V_{OUT}$ as a function of the input signal, as described in greater detail below. Controller 21 may also comprise any system, device, or apparatus configured to, implement an energy control loop 25 to control switching of switches integral to power converter 26 based on an output signal $V_{OUT}$, a boost voltage $V_{BST}$ generated by power converter 26, and/or other characteristics of switched mode amplifier 20 to control an amount of electrical energy present in amplifier 20 (e.g., a cumulative energy stored on capacitor 40 and capacitor 60), as described in greater detail below.

Loop filter 22 of audio control loop 23 may comprise any system, device, or apparatus configured to receive an input signal (e.g., audio input signal $V_{IN}$ or a derivative thereof) and a feedback signal (e.g., audio output signal $V_{OUT}$, a derivative thereof, or other signal indicative of audio output signal $V_{OUT}$) and based on such input signal and feedback signal, generate a controller input signal to be communicated to output stage switch controller 24. In some embodiments, such controller input signal may comprise a signal indicative of an integrated error between the input signal and the feedback signal. In other embodiments, such controller input signal may comprise a signal indicative of a target current signal to be driven as an output current $I_{OUT}$ or a target voltage signal to be driven as an output voltage $V_{OUT}$ to a load coupled to the output terminals of output stage 28.

Output stage switch controller 24 of audio control loop 23 may comprise any system, device, or apparatus configured to, based on the controller input signal received from loop filter 22, control switches integral to output stage 28 in order to transfer electrical energy from capacitor 40 to output load 56 or transfer electrical energy from output load 56 to capacitor 40 in order to generate output voltage $V_{OUT}$ as a function of the input signal.

As shown in FIG. 3, energy control loop 25 may comprise a power converter switch controller 27. Power converter switch controller 27 may comprise any system, device, or apparatus configured to control switching of switches integral to power converter 26 based on output signal $V_{OUT}$, a boost voltage $V_{BST}$ generated by power converter 26, and/or other characteristics of switched mode amplifier 20 to transfer electrical energy from an input of power converter 26 to capacitor 40 in order to control an amount of electrical energy present in amplifier 20 (e.g., a cumulative energy stored on capacitor 40 and capacitor 60), as described in greater detail below.

Power converter 26 may comprise any system, device, or apparatus configured to operate a converter to transfer charge from a source of electrical energy (e.g., a battery) coupled to the terminals of supply voltage $V_{SUPPLY}$ to the output of power converter 26 to generate a boost voltage $V_{BST}$. In some embodiments, power converter 26 may comprise a boost converter that may receive voltage $V_{SUPPLY}$ (e.g., provided by power supply 10) at its input, and may generate at its output boost voltage $V_{BST}$ which is larger in magnitude than supply voltage $V_{SUPPLY}$. Accordingly, power converter 26 may include a power inductor 35, switches 36 and 38, and a capacitor 40 arranged as shown in a boost configuration.

Output stage 28 may receive at its input boost voltage $V_{BST}$, and may generate at its output an output voltage $V_{OUT}$. In some embodiments, output stage 28 may comprise a full-bridge output stage as shown in FIG. 3, including switches 42, 44, 46, and 48, inductors 50 and 54, and output load 56 driven by output stage 28. In FIG. 3, output load 56 is represented as a piezoelectric transducer modeled as a resistor 58 in series with a capacitor 60. When implemented as a piezoelectric transducer, output load 56 may comprise any system, device, or apparatus made with one or more materials configured to, in accordance with the piezoelectric effect, generate electric potential or voltage when mechanical strain is applied to such piezoelectric transducer, or conversely to undergo mechanical displacement or change in size or shape (e.g., change dimensions along a particular plane) when a voltage (e.g., output voltage $V_{OUT}$) is applied to the piezoelectric transducer. Accordingly, depending on functionality of personal mobile device 1, in operation, the piezoelectric transducer may, responsive to electronic signals received by amplifier 20, generate acoustic energy in the form of audible sound external to personal mobile device 1, thus acting as an output loudspeaker (e.g., speaker 7) for personal mobile device 1. Additional description of the functionality of such a piezoelectric transducer and systems and methods for integrating such a piezoelectric transducer into a mobile device are disclosed in U.S. patent application Ser. No. 15/822,712, filed Nov. 27, 2017, and incorporated by reference herein.

However, despite output load 56 being shown as a piezoelectric transducer in FIG. 3, output load 56 may include any suitable transducer or other load.

In existing approaches to driving output transducers, such as loudspeakers with a primarily resistive load, switches (e.g., switches 36 and 38) of a boost converter (e.g., power converter 26) may be operated so as to regulate boost voltage $V_{BST}$ to a substantially constant voltage greater than an input voltage (e.g., supply voltage $V_{SUPPLY}$) received by the boost converter, such that a storage capacitor (e.g., capacitor 40) serves as a constantly replenished store of energy for driving an output transducer. However, unlike traditional loudspeakers and other transducers which may be primarily resistive, piezoelectric transducers and/or other transducers may be capable of storing charge as an incidence of their operation, such as capacitor 60 of output load 56 shown in FIG. 3. Accordingly, energy stored in such a transducer may be returned to another energy storage device (e.g., capacitor 40) until again required by output load 56, thus potentially reducing energy required from a battery or other supply to the boost converter. Thus, electrical energy may "ping pong" between such an output transducer and an energy storage device, with additional energy only being required due to losses within amplifier 20, including without limitation resistances of the driving circuitry (e.g., switches 42, 44, 46, and 48), resistance of the load (e.g., resistor 58), inductance losses (e.g., of inductors 50 and 54), gate driver losses, parasitic capacitance losses, and/or other losses in which energy dissipates from amplifier 20. When such additional energy is required, the boost converter may be enabled to provide such additional energy. In the embodiments represented by FIG. 3, power converter 26 may provide such energy from a source of electrical energy coupled to the input of power converter (e.g., a source of energy providing supply voltage $V_{SUPPLY}$) to capacitor 40, such that a cumulative electrical energy stored on capacitor 40 and within load 56 (e.g., on capacitor 60) remains substantially constant.

Figure 4:
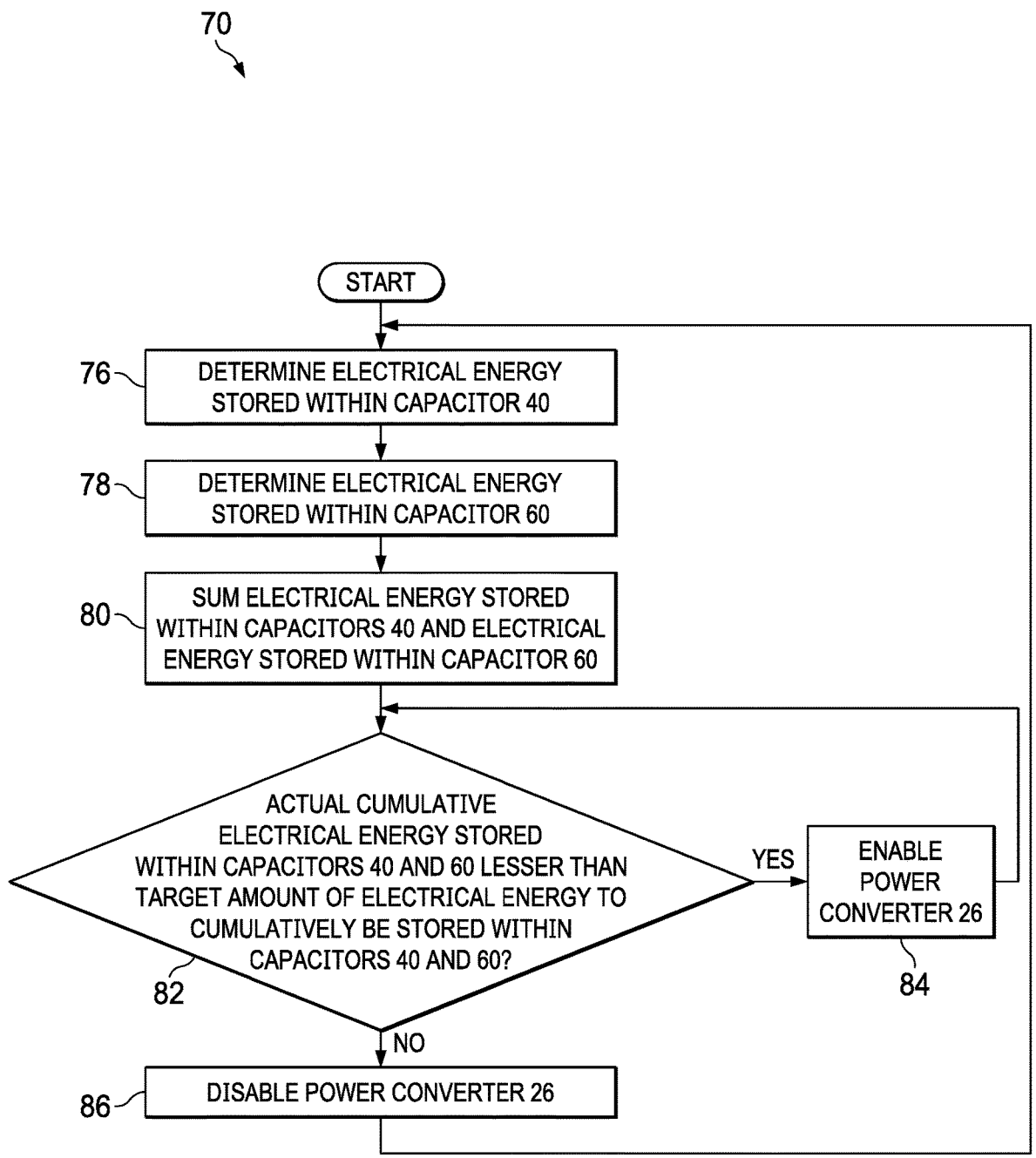
FIG. 4 illustrates a flow chart of an example method for regulating a boost converter output in a switched-mode power converter of a transducer, in accordance with embodiments of the present disclosure.

To further illustrate, FIG. 4 illustrates a flow chart of an example method 70 for regulating a boost converter output in a switched-mode power converter of a transducer, in accordance with embodiments of the present disclosure. According to some embodiments, method 70 may begin at step 76. As noted above, teachings of the present disclosure may be implemented in a variety of configurations of personal mobile device 1.

At step 76, power converter switch controller 27 may receive one or more signals indicative of an amount of electrical energy stored within capacitor 40, and from the one or more signals, determine the energy stored within capacitor 40. For example, such one or more signals indicative of an amount of electrical energy stored within capacitor 40 may comprise the boost voltage $V_{BST}$ across capacitor 40. Similarly, at step 78, power converter switch controller 27 may receive one or more signals indicative of an amount of electrical energy stored within capacitor 60, and from the one or more signals, determine the energy stored within capacitor 60. For example, such one or more signals indicative of an amount of electrical energy stored within capacitor 60 may comprise the output voltage $V_{OUT}$ across output load 56. At step 80, power converter switch controller 27 may sum the electrical energy stored within capacitor 40 with the electrical energy stored within capacitor 60 to determine an actual cumulative electrical energy stored within capacitors 40 and 60.

At step 82, controller 21 may compare the actual cumulative electrical energy stored within capacitors 40 and 60 to the target amount of electrical energy to cumulatively be stored within capacitors 40 and 60. For example, in some embodiments, the target amount of electrical energy to cumulatively be stored within capacitors 40 and 60 may be set based on a dynamic range of output voltage $V_{OUT}$. In other words, the target amount of cumulative energy may be an amount approximately equal to an amount of energy that must be present within load 56 to generate a maximum output voltage $V_{OUT}$. If the actual cumulative electrical energy stored within capacitors 40 and 60 is less than the target amount of electrical energy to cumulatively be stored within capacitors 40 and 60, method 70 may proceed to step 84. Otherwise, method 70 may proceed to step 86.

At step 84, responsive to the actual cumulative electrical energy stored within capacitors 40 and 60 being less than the target amount of electrical energy to cumulatively be stored within capacitors 40 and 60, controller 21 may enable power converter 26 and may commutate switches 36 and 38 of power converter 26 in order to transfer electrical energy from the input of power converter 26 (e.g., supply voltage $V_{SUPPLY}$) to capacitor 40 until such time as the actual cumulative electrical energy stored within capacitors 40 and 60 equal to the target amount of electrical energy to cumulatively be stored within capacitors 40 and 60 (e.g., as shown by operation of method 70 returning to step 82 from step 84).

At step 86, responsive to the actual cumulative electrical energy stored within capacitors 40 and 60 being greater than or equal to the target amount of electrical energy to cumulatively be stored within capacitors 40 and 60, controller 21 may disable power converter 26 (e.g., by leaving switch 38 of power converter 26 open). After completion of step 86, method 70 may proceed again to step 76.

During all steps of method 70, controller 21 may also control and commutate switches 42, 44, 46, and 48 of output stage 28 as to generate output voltage $V_{OUT}$ as an amplified version of input signal INPUT, thus transferring electrical energy from capacitor 40 to output load 56, or vice versa, as needed to appropriately generate output voltage $V_{OUT}$.

Although FIG. 4 discloses a particular number of steps to be taken with respect to method 70, method 70 may be executed with greater or lesser steps than those depicted in FIG. 4. In addition, although FIG. 4 discloses a certain order of steps to be taken with respect to method 70, the steps comprising method 70 may be completed in any suitable order.

Method 70 may be implemented using controller 21 or any other system operable to implement method 70. In certain embodiments, method 70 may be implemented partially or fully in software and/or firmware embodied in computer-readable media.

Figure 5:
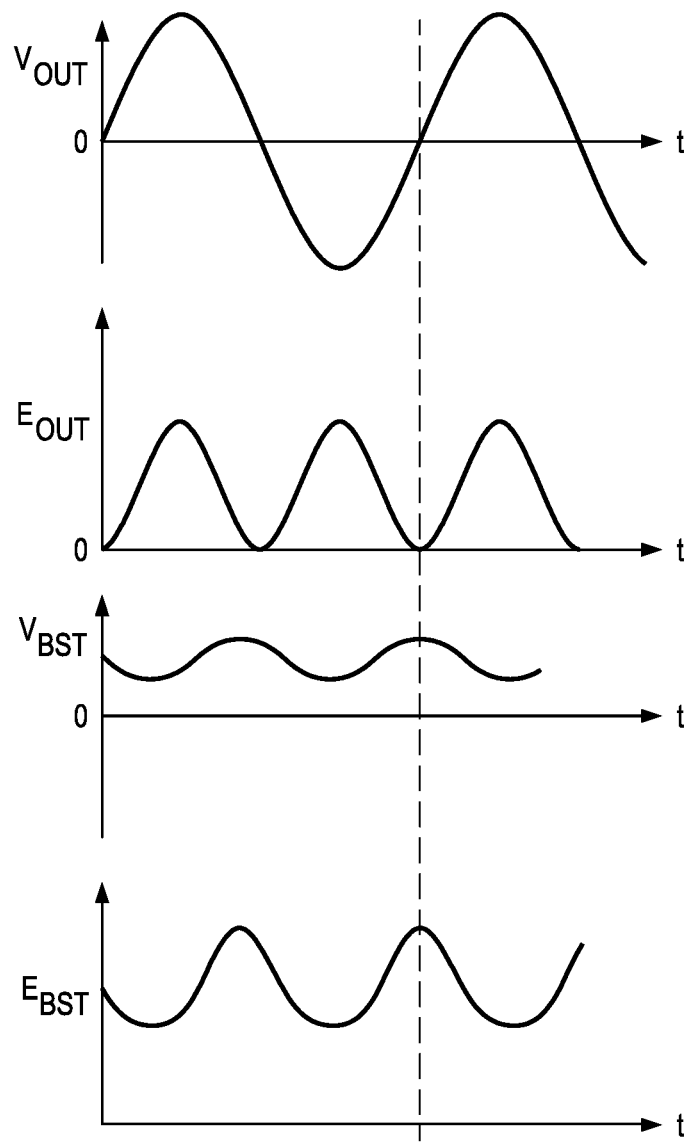
FIG. 5 illustrates various graphs of waveforms for electrical parameters of amplifier versus time, in accordance with embodiments of the present disclosure.

FIG. 5 illustrates various graphs of waveforms for electrical parameters of amplifier 20 versus time, in accordance with embodiments of the present disclosure. As shown in FIG. 5, operation of method 70 described above may cause boost voltage $V_{BST}$ to be regulated as a function of the instantaneous output voltage $V_{OUT}$, as energy is transferred from output load 56 (energy of output load 56 shown in FIG. 5 as $E_{OUT}$) to capacitor 40 (energy of capacitor 40 shown in FIG. 5 as $E_{BST}$) and vice versa to appropriately control output voltage $V_{OUT}$ as an amplified version of input signal INPUT, and energy is transferred from the input of power converter 26 to maintain the cumulative energy of capacitor 40 and output load 56 at the target cumulative energy. For example, as energy $E_{OUT}$ and output voltage $V_{OUT}$ increase, energy $E_{BST}$ and boost voltage $V_{BST}$ may decrease, and as energy $E_{OUT}$ and output voltage $V_{OUT}$ decrease, energy $E_{BST}$ and boost voltage $V_{BST}$ may increase.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A system comprising:
    a power converter configured to transfer electrical energy from a source of electrical energy coupled to an input of the power converter to an output of the power converter, the power converter comprising an energy storage device coupled to the output of the power converter and configured to store the electrical energy transferred from the source of electrical energy;
    an output stage configured to transfer electrical energy between the energy storage device and a load coupled to an output of the output stage, wherein the load comprises capacitive energy storage, and wherein the output stage comprising a plurality of switches; and
    a controller configured to:
        control commutation of the plurality of switches of the output stage in order to transfer charge between the energy storage device and the load to generate an output voltage across the load as an amplified version of an input signal; and
        control the power converter in order to regulate a cumulative electrical energy present in the system at an energy target.

2. The system of claim 1, wherein the cumulative electrical energy is equal to a sum of a first electrical energy stored in the energy storage device and a second electrical energy stored in the load.

3. The system of claim 1, wherein the energy target is based on a dynamic range of a signal on the load.

4. The system of claim 1, wherein the controller is configured to control the power converter and the output stage in order to regulate a voltage at the output of the power converter responsive to an instantaneous magnitude of the output voltage by decreasing the voltage at the output of the power converter responsive to increases to the magnitude of the output voltage and increasing the voltage at the output of the power converter responsive to decreases to the magnitude of the output voltage while maintaining the cumulative electrical energy present in the system at the energy target.

5. The system of claim 1, wherein the controller is configured to control the cumulative electrical energy present in the system at the energy target by:
    determining the cumulative amount of energy stored within the energy storage device and the load;
    enabling the power converter to transfer electrical energy between the source of electrical energy and the energy storage device responsive to the cumulative amount of energy being lesser than the energy target; and
    disabling the power converter from transferring electrical energy between the source of electrical energy and the energy storage device responsive to the cumulative amount of energy being greater than or equal to the energy target.

6. The system of claim 5, wherein the controller is configured to determine an amount of energy stored in a circuit element comprising one of the energy storage device and the load based on a voltage associated with the circuit element.

7. The system of claim 1, wherein the power converter further comprises:
    a power inductor coupled to a first terminal of the source of electrical energy via a first terminal of the power inductor;
    a first switch coupled between a second terminal of the power inductor and a second terminal of the source of electrical energy; and
    a second switch coupled between the second terminal of the power inductor and a first terminal of the energy storage device.

8. The system of claim 1, wherein the energy storage device comprises a capacitor.

9. The system of claim 1, wherein the load comprises a piezoelectric transducer.

10. The system of claim 1, wherein the output stage comprises a switched-mode full bridge comprising the plurality of switches.

11. The system of claim 1, wherein the input signal is an audio signal.

12. A method comprising:
    controlling commutation of a plurality of switches of an output stage comprising the plurality of switches in order to transfer charge between an energy storage device and a load to generate an output voltage across the load as an amplified version of an input signal, wherein the load comprises capacitive energy storage; and controlling a power converter in order to regulate a cumulative electrical energy at an energy target, wherein the power converter is configured to transfer electrical energy from a source of electrical energy coupled to an input of the power converter to the energy storage device coupled to the output of the power converter and configured to store the electrical energy transferred from the source of electrical energy.

13. The method of claim 12, wherein the cumulative electrical energy is equal to a sum of a first electrical energy stored in the energy storage device and a second electrical energy stored in the load.

14. The method of claim 12, wherein the energy target is based on a dynamic range of a signal on the load.

15. The method of claim 12, further comprising controlling the power converter and the output stage in order to regulate a voltage at the output of the power converter responsive to an instantaneous magnitude of the output voltage by decreasing the voltage at the output of the power converter responsive to increases to the magnitude of the output voltage and increasing the voltage at the output of the power converter responsive to decreases to the magnitude of the output voltage while maintaining the cumulative electrical energy present in the system at the energy target.

16. The method of claim 12, further comprising controlling the cumulative electrical energy present in the system at the energy target by:
    determining the cumulative amount of energy stored within the energy storage device and the load;
    enabling the power converter to transfer electrical energy between the source of electrical energy and the energy storage device responsive to the cumulative amount of energy being lesser than the energy target; and
    disabling the power converter from transferring electrical energy between the source of electrical energy and the energy storage device responsive to the cumulative amount of energy being greater than or equal to the energy target.

17. The method of claim 16, further comprising determining an amount of energy stored in a circuit element comprising one of the energy storage device and the load based on a voltage associated with the circuit element.

18. The method of claim 12, wherein the power converter further comprises:
    a power inductor coupled to a first terminal of the source of electrical energy via a first terminal of the power inductor;
    a first switch coupled between a second terminal of the power inductor and a second terminal of the source of electrical energy; and
    a second switch coupled between the second terminal of the power inductor and a first terminal of the energy storage device.

19. The method of claim 12, wherein the energy storage device comprises a capacitor.

20. The method of claim 12, wherein the load comprises a piezoelectric transducer.

21. The method of claim 12, wherein the output stage comprises a switched-mode full bridge comprising the plurality of switches.

22. The method of claim 12, wherein the input signal is an audio signal.

* * * * *